(12) United States Patent
Chen et al.

(10) Patent No.: US 9,768,137 B2
(45) Date of Patent: Sep. 19, 2017

(54) STUD BUMP STRUCTURE FOR SEMICONDUCTOR PACKAGE ASSEMBLIES

(75) Inventors: Meng-Tse Chen, Changzhi Township (TW); Hsiu-Jen Lin, Zhubei (TW); Chih-Wei Lin, Xinfeng Township (TW); Cheng-Ting Chen, Taichung (TW); Ming-Da Cheng, Jhubei (TW); Chung-Shi Liu, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/460,412

(22) Filed: Apr. 30, 2012

(65) Prior Publication Data
US 2013/0285238 A1   Oct. 31, 2013

(51) Int. Cl.
*H01L 23/00* (2006.01)
*H01L 23/498* (2006.01)
(Continued)

(52) U.S. Cl.
CPC .......... *H01L 24/14* (2013.01); *H01L 21/4853* (2013.01); *H01L 23/49816* (2013.01);
(Continued)

(58) Field of Classification Search
CPC ............. H01L 2023/34; H01L 2023/36; H01L 2023/40; H01L 23/488; H01L 23/52; H01L 23/36; H01L 23/40; H01L 2224/14179; H01L 2224/1418; H01L 2224/14183; H01L 2224/17179; H01L 2224/1712; H01L 2224/1412; H01L 2224/1451; H01L 2224/14515; H01L 2224/14517; H01L 2224/14519; H01L 2224/1751; H01L 2224/17515; H01L 2224/17519
(Continued)

(56) References Cited

U.S. PATENT DOCUMENTS 4,097,266 A * 6/1978 Takahashi ............... B22F 1/025
  148/24
5,569,960 A * 10/1996 Kumazawa ......... H01L 23/3128
  257/738
(Continued)

FOREIGN PATENT DOCUMENTS

JP  2005311209 A  * 11/2005
KR  10-2005-0001159  1/2005
(Continued)

OTHER PUBLICATIONS

Office Action dated Feb. 20, 2014 and English translation from corresponding application No. KR 10-2012-0128152.
Office Action dated Jul. 24, 2014 and English translation from corresponding No. KR 10-2012-0128152.
Office Action dated Jun. 3, 2015 and English translation from corresponding No. KR 10-2015-0060465.

*Primary Examiner* — David Zarneke
(74) *Attorney, Agent, or Firm* — Haynes and Boone, LLP

(57) ABSTRACT

A semiconductor package structure comprises a substrate, a die bonded to the substrate, and one or more stud bump structures connecting the die to the substrate, wherein each of the stud bump structures having a stud bump and a solder ball encapsulating the stud bump to enhance thermal dissipation and reduce high stress concentrations in the semiconductor package structure.

18 Claims, 4 Drawing Sheets

(51) Int. Cl.
  *H01L 25/10* (2006.01)
  *H01L 21/48* (2006.01)
  *H01L 23/367* (2006.01)

(52) U.S. Cl.
  CPC .............. *H01L 24/11* (2013.01); *H01L 24/13* (2013.01); *H01L 24/73* (2013.01); *H01L 25/105* (2013.01); *H01L 23/3677* (2013.01); *H01L 24/16* (2013.01); *H01L 24/32* (2013.01); *H01L 24/45* (2013.01); *H01L 24/48* (2013.01); *H01L 2224/1134* (2013.01); *H01L 2224/131* (2013.01); *H01L 2224/1308* (2013.01); *H01L 2224/13076* (2013.01); *H01L 2224/13124* (2013.01); *H01L 2224/13144* (2013.01); *H01L 2224/13147* (2013.01); *H01L 2224/14135* (2013.01); *H01L 2224/14136* (2013.01); *H01L 2224/16225* (2013.01); *H01L 2224/32145* (2013.01); *H01L 2224/32225* (2013.01); *H01L 2224/45124* (2013.01); *H01L 2224/45144* (2013.01); *H01L 2224/45147* (2013.01); *H01L 2224/48091* (2013.01); *H01L 2224/48227* (2013.01); *H01L 2224/73104* (2013.01); *H01L 2224/73204* (2013.01); *H01L 2225/0651* (2013.01); *H01L 2225/1023* (2013.01); *H01L 2225/1058* (2013.01); *H01L 2924/00014* (2013.01); *H01L 2924/15331* (2013.01); *H01L 2924/15787* (2013.01); *H01L 2924/3512* (2013.01)

(58) Field of Classification Search
  USPC .... 257/738, 781, 786, 692, 712; 228/180.22
  See application file for complete search history.

(56) References Cited

U.S. PATENT DOCUMENTS

| | | | | |
|---|---|---|---|---|
| 5,598,036 | A * | 1/1997 | Ho | H01L 23/49816 257/673 |
| 5,633,204 | A * | 5/1997 | Tago et al. | 438/614 |
| 5,740,956 | A * | 4/1998 | Seo et al. | 228/180.22 |
| 5,744,759 | A * | 4/1998 | Ameen | H01R 4/02 174/260 |
| 5,813,115 | A * | 9/1998 | Misawa et al. | 29/832 |
| 5,907,187 | A * | 5/1999 | Koiwa | H01L 23/49816 257/703 |
| 6,303,408 | B1 * | 10/2001 | Smith | H01L 21/563 257/678 |
| 6,330,166 | B1 * | 12/2001 | Aoyama | H01L 23/49816 174/260 |
| 6,337,445 | B1 * | 1/2002 | Abbott | H01L 23/49816 174/257 |
| 6,518,667 | B1 * | 2/2003 | Ichida | H01L 23/49816 257/734 |
| 6,541,857 | B2 * | 4/2003 | Caletka | H01L 23/49816 257/669 |
| 6,621,168 | B2 * | 9/2003 | Sundahl | H05K 3/4614 257/737 |
| 6,798,667 | B2 * | 9/2004 | Chan | B23K 1/0016 257/738 |
| 6,915,185 | B2 * | 7/2005 | Yamamoto | G06Q 50/06 322/44 |
| 6,927,491 | B1 * | 8/2005 | Yamada | H01L 23/49838 257/737 |
| 6,965,160 | B2 * | 11/2005 | Cobbley et al. | 257/686 |
| 7,038,144 | B2 * | 5/2006 | Yasuda | H01L 23/49838 174/260 |
| 7,042,088 | B2 * | 5/2006 | Ho | H01L 24/14 257/738 |
| 7,053,491 | B2 * | 5/2006 | Martin | H01L 21/4853 257/730 |
| 7,062,088 | B1 * | 6/2006 | Clauson | H04N 19/147 345/563 |
| 7,265,046 | B2 * | 9/2007 | Kondo | H05K 3/3436 257/E21.476 |
| 7,271,497 | B2 * | 9/2007 | Joshi et al. | 257/780 |
| 7,501,337 | B2 * | 3/2009 | Joshi et al. | 438/612 |
| 7,554,201 | B2 * | 6/2009 | Kang et al. | 257/772 |
| 7,557,443 | B2 * | 7/2009 | Ye | H01L 21/561 257/723 |
| 7,621,762 | B2 * | 11/2009 | Liaw | B23K 35/02 257/738 |
| 7,679,188 | B2 * | 3/2010 | Nishimura | H01L 21/563 257/737 |
| 7,750,466 | B2 * | 7/2010 | Rothman | H01L 23/10 257/686 |
| 7,838,988 | B1 * | 11/2010 | Gurrum | H01L 23/3171 257/706 |
| 7,846,829 | B2 * | 12/2010 | Tanaka | H01L 23/49811 257/738 |
| 7,969,004 | B2 * | 6/2011 | Ohnishi | H01L 24/11 257/737 |
| 8,115,310 | B2 * | 2/2012 | Masumoto et al. | 257/738 |
| 8,669,173 | B2 * | 3/2014 | Lee | H01L 21/4846 257/780 |
| 8,686,560 | B2 * | 4/2014 | Parvarandeh | H01L 24/06 257/737 |
| 8,823,159 | B2 * | 9/2014 | Ye | H01L 21/561 257/686 |
| 8,928,134 | B2 * | 1/2015 | Huang | H01L 23/3135 257/686 |
| 2002/0047216 | A1 * | 4/2002 | Jiang | H01L 24/16 257/778 |
| 2002/0197769 | A1 * | 12/2002 | Choi | H01L 23/3128 438/109 |
| 2003/0134451 | A1 * | 7/2003 | Chen | H01L 25/0657 438/109 |
| 2003/0146012 | A1 * | 8/2003 | Song | H01L 25/0657 174/538 |
| 2003/0197284 | A1 * | 10/2003 | Khiang | H01L 23/3114 257/777 |
| 2003/0202332 | A1 * | 10/2003 | Reinikainen | H01L 23/49816 361/767 |
| 2004/0032013 | A1 | 2/2004 | Cobbley et al. | |
| 2004/0145039 | A1 * | 7/2004 | Shim | H01L 25/0657 257/678 |
| 2004/0262734 | A1 * | 12/2004 | Yoo | H01L 25/0657 257/686 |
| 2004/0262774 | A1 | 12/2004 | Kang et al. | |
| 2005/0133916 | A1 * | 6/2005 | Karnezos | H01L 23/4334 257/738 |
| 2007/0152331 | A1 * | 7/2007 | Kang et al. | 257/737 |
| 2008/0224309 | A1 * | 9/2008 | Hori | H01L 24/81 257/737 |
| 2009/0065943 | A1 * | 3/2009 | Rothman | H01L 23/10 257/772 |
| 2011/0248398 | A1 * | 10/2011 | Parvarandeh | H01L 24/06 257/737 |
| 2012/0299197 | A1 * | 11/2012 | Kwon | H01L 25/0657 257/777 |
| 2013/0277838 | A1 * | 10/2013 | Yu | H01L 24/13 257/738 |
| 2013/0292831 | A1 * | 11/2013 | Liu | H01L 23/488 257/738 |
| 2015/0008576 | A1 * | 1/2015 | Khandekar | H01L 24/11 257/737 |
| 2016/0118351 | A1 * | 4/2016 | Yu | H01L 24/14 257/737 |

FOREIGN PATENT DOCUMENTS

| | | |
|---|---|---|
| KR | 10-2008-0044235 | 5/2008 |
| KR | 10-2011-0014261 | 2/2011 |
| WO | WO 2007/016088 | 2/2007 |

* cited by examiner

STUD BUMP STRUCTURE FOR SEMICONDUCTOR PACKAGE ASSEMBLIES

FIELD

The disclosure relates generally to chip packaging, and more particularly, to stud bump structures for semiconductor package assemblies, such as flip chip, wafer level chip scale package, and package on package assemblies.

BACKGROUND

A flip chip assembly includes a direct electrical connection of a downward facing (that is, "flipped") semiconductor chip, or die, onto a carrier, such as a ceramic substrate or a circuit board, using conductive bump bond pads of the chip. Flip chip assemblies are typically made by placing solder bumps on the bump bond pads of the chip, attaching the solder bumped chip to a carrier, and applying an adhesive underfill between the chip and the carrier.

The bumps of the flip chip assembly serve several functions but are susceptible to failures caused by stresses. Of those functions, the bumps provide electrical conductive paths from the chip to the substrate on which the chip is mounted. The bumps also provide part of the mechanical mounting of the chip to the substrate. Unfortunately, bumps are prone to cracking generally caused by stresses, including stress caused by thermal expansion mismatch between the chip and the carrier substrate. The significant difference of coefficients of thermal expansion introduces stress to the structure when thermal changes occur. Most of the stress concentrates on the corners of the chip and/or flip chip assembly, and the larger the chip, the more stress concentration on the die and/or flip chip assembly. FIG. 2 is a portion of a flip chip assembly illustrating a solder ball or bump 40 mounted to a bond pad 30 of a chip 20. Due to stress caused by the thermal expansion mismatch between the materials in the flip chip assembly, a crack 50 develops in solder bump 40. Such cracks may form more easily under the stress experienced at the joint and may easily propagate across the length of the solder bump 40.

The use of copper in the metal bumps further worsens the problem. Since copper is rigid, a high stress may be applied on the solders adjoining the copper bumps and hence the solders are more prone to cracking.

One solution to the problem caused by differences in coefficients of thermal expansion is to fill the gap between the chip and the substrate using an epoxy underfill. Underfill helps spread the stress and protect the solder bumps or balls. But sometimes the underfill has a high coefficient of thermal expansion that creates a mismatch between the expansion of the chip and the underfill. This mismatch introduces more stress in the package that can result in failures.

Wafer level chip scale package (WLCSP) has been introduced in recent years for generally increasing density, performance, and cost-effectiveness, while decreasing the weight and size of the devices in the electronic packaging industry and to fulfill market demands toward increased miniaturization and functionality. One disadvantage of current WLCSP technology is the formation of cracks between the solder ball and the electrode post. The solder ball or bump is typically placed onto the bump electrode or post directly, relying on the soldered joint for structural integrity. The different layers making up the WLCSP device typically have different coefficients of thermal expansion. As a result, a relatively large stress derived from this difference is exhibited on the joint between the post and the bump electrode, which often causes cracks to form in the bonding area between the bump electrode/post and the solder ball or bump.

BRIEF DESCRIPTION OF DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

In the following description, specific details are set forth to provide a thorough understanding of embodiments of the present disclosure. However, one having an ordinary skill in the art will recognize that embodiments of the disclosure can be practiced without these specific details. In some instances, well-known structures and processes are not described in detail to avoid unnecessarily obscuring embodiments of the present disclosure.

Reference throughout this specification to "one embodiment" or "an embodiment" means that a particular feature, structure, or characteristic described in connection with the embodiment is included in at least one embodiment of the present disclosure. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

Figure 1:
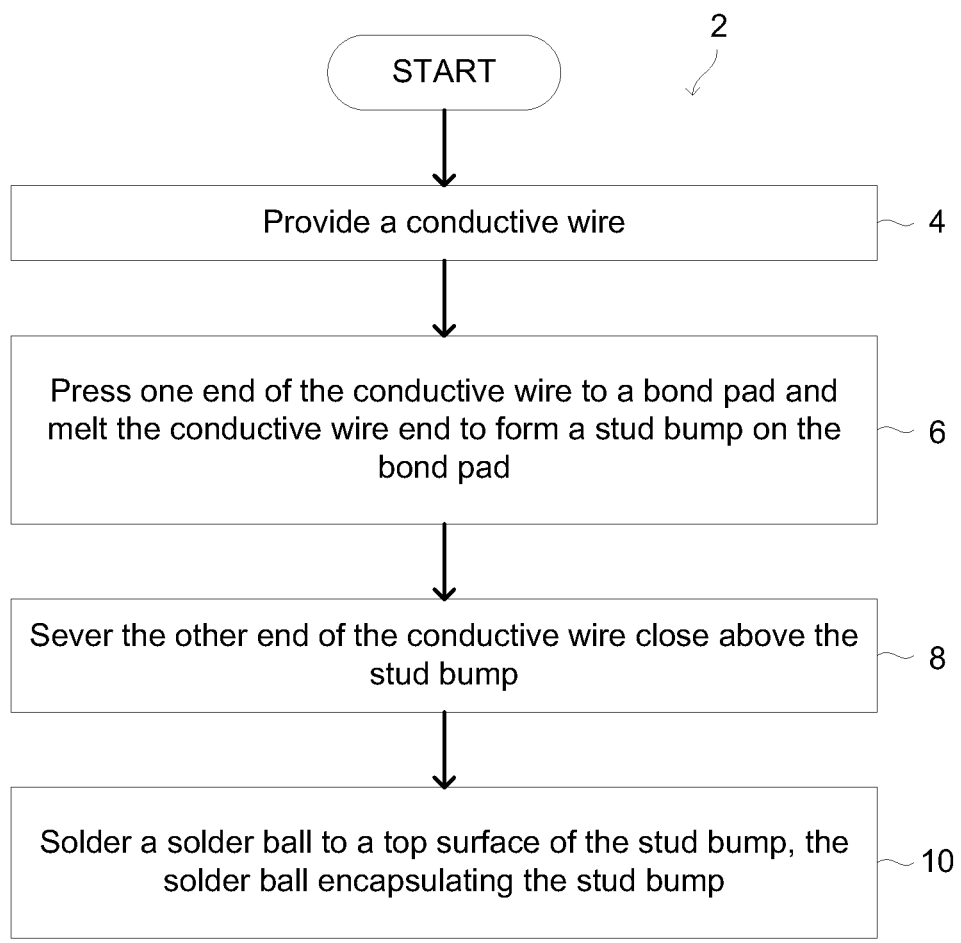
FIG. 1 is a flowchart illustrating a method for fabricating a stud bump structure for semiconductor package assemblies, according to one embodiment of the present disclosure.
Figure 3:
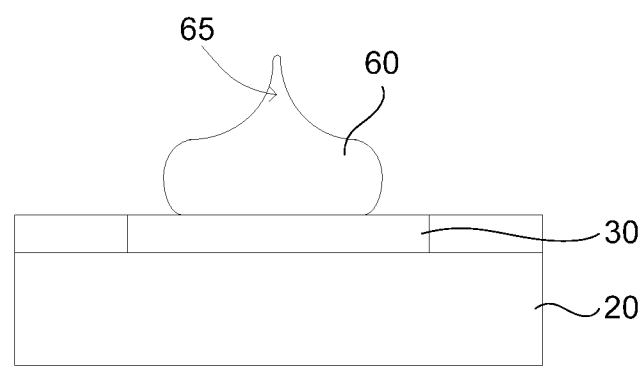
FIG. 3 is a cross-sectional view of a portion of a semiconductor device package at an initial stage of forming a stud bump structure, according to one embodiment of the present disclosure.

Illustrated in FIG. 1 is a flowchart of a method 2 for fabricating a stud bump structure for use in semiconductor package assemblies such as, for example flip chip, wafer level chip scale package, and package on package assemblies, according to various aspects of the present disclosure. The stud bump structure is performed by a stud bump bonder and/or wire bonding tool. Referring to FIG. 1, the method includes block 4, in which a conductive wire is provided. The conductive wire may be comprised of aluminum, aluminum alloy, copper, copper alloy, gold, gold alloy, a lead-free conductor and the like. The method 2 includes block 6, in which one end of the conductive wire is pressed onto a bond pad. The end of the conductive wire is then melted to form a sphere or a stud bump on the bond pad. A wire bonding tool presses this sphere against the bond pad, applying mechanical force, heat, and ultrasonic energy to create a metallic connection. The method 2 includes a block 8, in which the other end of the conductive wire close above the stud bump is severed by a wire cutter. If the move is purely vertical, a "tail" can be left on top of the stud bump. The height and repeatability of this tail is largely dependant on the composition of the wire. FIG. 3 is a cross-sectional view of a stud bump 60 having a tail 65 formed on a bond pad 30 of a die 20. The resulting ball or stud bump 60 remaining on the bond pad 30 provides a permanent, reliable connection to the underlying bond pad metal. It is understood by those skilled in the art that the size of the stud bump 60 is dependant on the size of the wire and the type, as well as the bonding tool and the bonding process.

For applications in which more of a standoff is desirable to help compensate for thermal mismatch, in another embodiment a method allows for the stacking of one stud bump on top of another.

Figure 2:
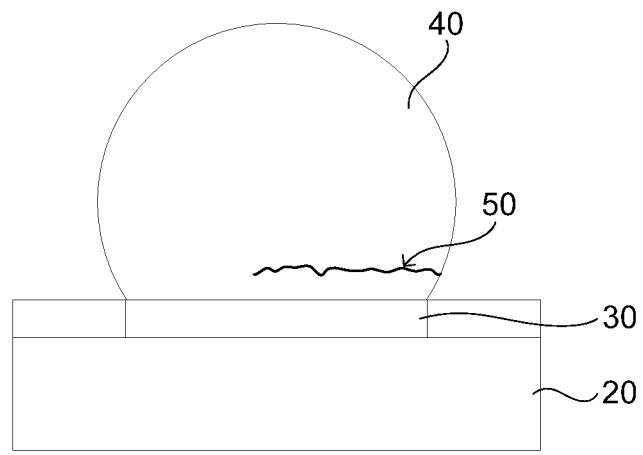
FIG. 2 is a portion of a flip chip assembly exemplifying cracking in the solder ball or bump.
Figure 4:
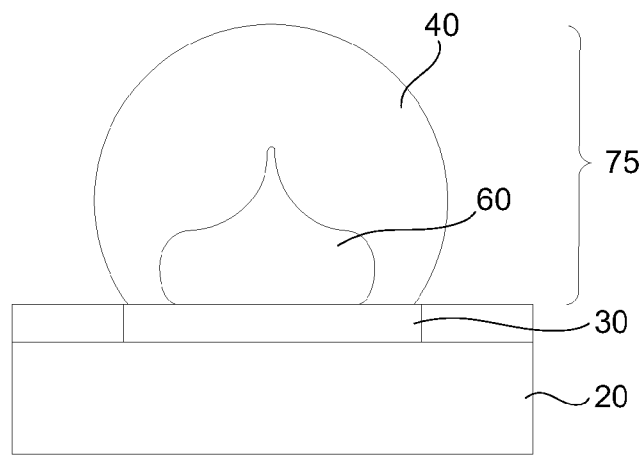
FIG. 4 is a cross-sectional view of a portion of the semiconductor device package of FIG. 3 at another stage of forming a stud bump structure, according to one embodiment of the present disclosure.

The method 2 includes a block 10, in which a solder ball is soldered onto a top surface of the stud bump, the solder ball encapsulating the stud bump. In FIG. 4, a solder ball 40 is soldered onto stud bump 60 and forms around and encapsulates stud bump 60 to form a stud bump structure 75. By forming solder ball 40 around stud bump 60, the shear strength of the joint holding solder ball 40 to die 20 is increased. Thus, a crack, such as crack 50 shown in FIG. 2 that starts at one end of the solder ball 40 will preferably not propagate as readily as in a solder ball devoid of a stub bump 60. The stud bump structure 75 preferably retards the propagation of cracks and increases the shear strength of the solder joint.

It is understood that additional processes may be performed before, during, or after the blocks 2-10 shown in FIG. 1 to complete the fabrication of the stud bump structure, but these additional processes are not discussed herein in detail for the sake of simplicity.

Figure 5:
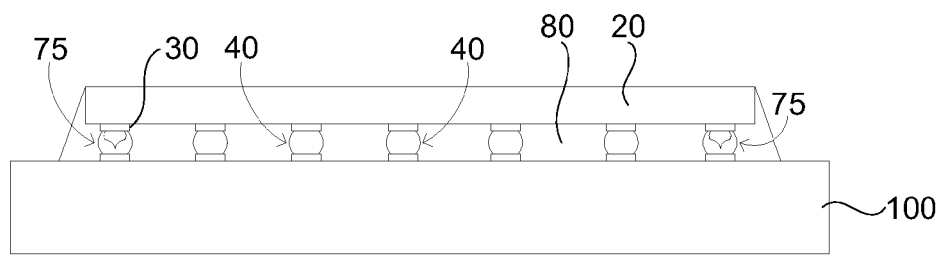
FIG. 5 is a cross-sectional view of a flip chip bump assembly having one or more stud bump structures configured in the flip chip assembly, according to one embodiment of the present disclosure.
Figure 6:
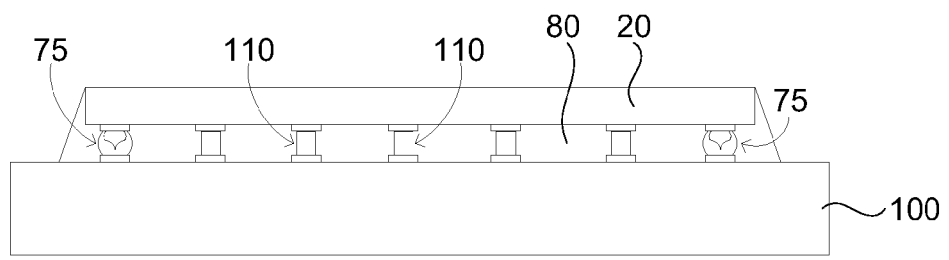
FIG. 6 is a cross-sectional view of a flip chip copper pillar assembly having one or more stud bump structures configured in the flip chip assembly, according to one embodiment of the present disclosure.

Inventive aspects of the present disclosure can be implemented in a variety of semiconductor package assemblies, such as flip chip, wafer level chip scale package, and package on package assemblies to enhance thermal dissipation and reduce high stress concentrations in the package assemblies. FIG. 5 depicts a cross-sectional view of a flip chip bump assembly having one or more stud bump structures 75 configured in the flip chip assembly, according to one embodiment of the present disclosure. The one or more stud bump structures 75 connect a die 20 to a substrate 100, wherein each of the stud bump structures 75 is connected to a bond pad 30. In one embodiment, stud bump structures 75 connect die 20 to substrate 100. As most of the stress concentrates on the corners of the die, in another embodiment the one or more stud bump structures 75 connect die 20 to substrate 100 at approximately the corners of the die 20. In another embodiment the one or more stud bump structures 75 connect die 20 to substrate 100 at approximately the periphery of the die 20. In yet another embodiment, a mix of stud bump structures 75 and solder balls or bumps 40 connect die 20 to substrate 100. In yet another embodiment, in lieu of solder bumps 40, a mix of stud bump structures 75 and copper pillars 110 connect die 20 to substrate 100, as shown in FIG. 6. FIGS. 5 and 6 also illustrate the addition of underfill 80 between die 20 and substrate 100 and around the stud bump structures 75, solder bumps 40, and/or copper pillars 110. Underfill 80 helps spread the stress and protects the stud bump structures 75, solder bumps 40, and/or copper pillars 110.

Figure 7:
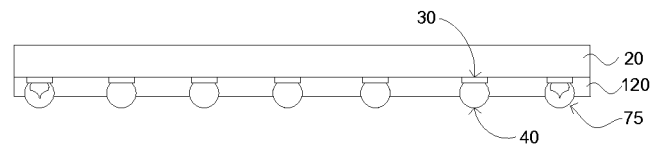
FIG. 7 is a cross-sectional view of a wafer level chip scale package having one or more stud bump structures configured in the package, according to one embodiment of the present disclosure.

FIG. 7 depicts a cross-sectional view of a wafer level chip scale package having one or more stud bump structures 75 configured in the package, according to one embodiment of the present disclosure. The one or more stud bump structures 75 are attached to a die 20, wherein each of the stud bump structures is connected to a bond pad 30. As most of the stress concentrates on the corners of the die 20, in one embodiment the one or more stud bump structures 75 are attached to the die at approximately the corners of the die 20. In another embodiment of the present disclosure, the one or more stud bump structures 75 are attached to die 20 at approximately the periphery of the die 20. In yet another embodiment, a mix of stud bump structures 75 and solder balls 40 are attached to die 20.

FIG. 7 also illustrate the addition of a moulding material 120 around the stud bump structures 75 and/or solder bumps 40. Moulding material 120 helps spread the stress and protects the stud bump structures 75 and/or solder bumps 40.

Figure 8:
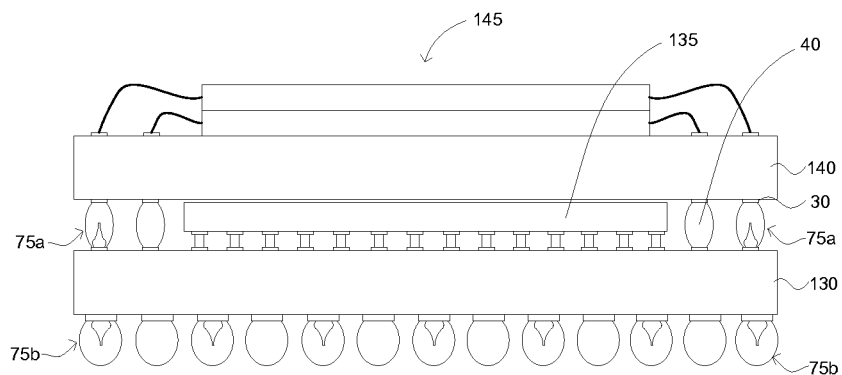
FIG. 8 is a cross-sectional view of a package-on-package structure having one or more stud bump structures configured in the package-on-package, according to one embodiment of the present disclosure.
Figure 9:
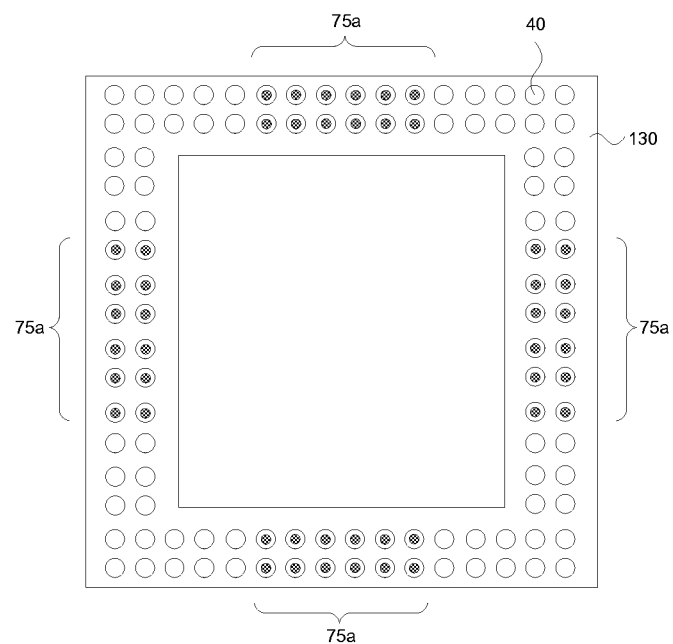
FIG. 9 is a plan view of the package-on-package structure of FIG. 8 showing placement of the stud bump structures, according to one embodiment of the present disclosure.

FIG. 8 is a cross-sectional view of a package-on-package structure having one or more stud bump structures configured in the package-on-package, according to one embodiment of the present disclosure. The package-on-package structure comprises a first substrate 130, a first die 135 attached to the first substrate 130, a second die 145 bonded to the second substrate 140, and one or more stud bump structures 75a connecting the second substrate 140 to the first substrate 130. Each of the stud bump structures is connected to a bond pad 30. As most of the stress concentrates at the corners of first substrate 130 and/or second substrate 140, in one embodiment the one or more stud bump structures 75a connect first substrate 130 to second substrate 140 at approximately the corners of either the first substrate 130 or the second substrate 140. In another embodiment, the one or more stud bump structures 75a connect first substrate 130 to second substrate 140 at approximately the mid sections of either the first substrate 130 or the second substrate 140. FIG. 9 is a plan view of the package-on-package structure of FIG. 8 showing placement of the stud bump structures 75a at the mid sections of first substrate 130. In another embodiment the one or more stud bump structures 75a connect first substrate 130 to second substrate 140 at approximately the periphery of either the first substrate 130 or the second substrate 140. In yet another embodiment, a mix of stud bump structures 75a and solder balls 40 connect first substrate 130 to second substrate 140.

To further dissipate heat from first die 135 and/or second die 145 and enhance thermal dissipation, one or more stud bump structures 75b are attached to an underside of first substrate 130, according to another embodiment.

It is understood that some of the above figures have been simplified for a better understanding of the inventive concepts of the present disclosure. The specific features and materials that are described in the above figures are not intended to limit additional or alternative applications of the present disclosure.

It is further understood that FIGS. 5-9 represent examples of the numbers of stud bump structures that may be formed onto bond pads or posts of the various embodiments on the present invention. Any number of stud bump structures may be formed in semiconductor package assemblies limited only by the technological limits or costs of forming the stud bump structures thereon. The various embodiments of the present invention are not limited to any one number of stud bump structures.

Advantages of one or more embodiments of the present disclosure may include one or more of the following.

In one or more embodiments, the thermal dissipation of the package structure is enhanced.

In one or more embodiments, the package structure is strengthened.

In one or more embodiments, cracks in solder balls or solder bumps caused by stress are reduced.

In one or more embodiments, the propagation of cracks that may form in solder balls or solder bumps is reduced, thus increasing the overall reliability of the package structure.

The present disclosure has described various exemplary embodiments. According to one embodiment, a package structure, includes a substrate, a die bonded to the substrate, and one or more stud bump structures connecting the die to the substrate, wherein each of the stud bump structures having a stud bump and a solder ball encapsulating the stud bump to enhance thermal dissipation and reduce high stress concentrations in the package structure.

According to another embodiment, a package on package structure, includes a first substrate, a first die bonded to the first substrate, a second substrate disposed over the first die and bonded to the first substrate, a second die bonded to the second substrate, and one or more first stud bump structures connecting the second substrate to the first substrate, wherein each of the first stud bump structures having a stud bump and a solder ball encapsulating the stud bump to enhance thermal dissipation and reduce high stress concentrations in the package on package structure.

According to yet another embodiment, a method of forming a stud bump structure in a package structure, includes providing a conductive wire, pressing one end of the conductive wire to a bond pad and melting the conductive wire end to form a stud bump on the bond pad, severing the other end of the conductive wire close above the stud bump, and soldering a solder ball to a top surface of the stud bump, the solder ball encapsulating the stud bump.

In the preceding detailed description, specific exemplary embodiments have been described. It will, however, be apparent to a person of ordinary skill in the art that various modifications, structures, processes, and changes may be made thereto without departing from the broader spirit and scope of the present disclosure. The specification and drawings are, accordingly, to be regarded as illustrative and not restrictive. It is understood that embodiments of the present disclosure are capable of using various other combinations and environments and are capable of changes or modifications within the scope of the claims.

What is claimed is:

1. A package structure, comprising:
   a die bonded to a substrate, wherein the die has a first periphery region adjacent a first edge of the die and a second periphery region adjacent a second edge of the die opposing the first edge of the die, and a center region interposing the first and second periphery regions;
   a plurality of stud bump structures connecting the die to the substrate, wherein each stud bump structure of the plurality of stud bump structures comprises a stud bump and a solder ball encapsulating the stud bump; and
   a plurality of conductive structures connecting the die to the substrate, wherein each of the conductive structures is free of an encapsulating configuration,
   wherein the plurality of stud bump structures and the plurality of conductive structures are arranged in a predetermined pattern wherein the plurality of stud bump structures are disposed within the first and second periphery regions of the die and the plurality of conductive structures are disposed in the center region of the die; and
   an underfill between the die and the substrate.

2. The package structure of claim 1, wherein a stud bump of the plurality of stud bump structures is connected to a bond pad.

3. The package structure of claim 1, wherein a conductive structure of the plurality of conductive structures is a solder bump connecting the die to the substrate.

4. The package structure of claim 1, wherein a conductive structure of the plurality of conductive structures is a copper pillar connecting the die to the substrate.

5. The package structure of claim 1, wherein each stud bump of the plurality of stud bump structures has a material comprising aluminum, aluminum alloy, copper, copper alloy, gold, or gold alloy.

6. The package structure of claim 1, wherein the underfill is disposed between the plurality of stud bump structures.

7. The package structure of claim 1, wherein a first one of the plurality of stud bump structures connects the die to the substrate at a first corner of the die in the first periphery region and a second one of the plurality of stud bump structures connects the die to the substrate at a second corner of the die in the second periphery region.

8. A package on package structure, comprising:
   a first substrate;
   a first die bonded to the first substrate;
   a second substrate disposed over the first die and bonded to the first substrate, such that the first die interposes the first and second substrates;
   a second die bonded to the second substrate;
   a plurality of first stud bump structures connecting the second substrate to the first substrate, wherein each first stud bump structure of the plurality of first stud bump structures comprises a stud bump disposed on a top surface of the first substrate and a solder ball encapsulating the stud bump, wherein the solder ball extends from the top surface of the first substrate to a bond pad disposed on a bottom surface of the second substrate; and
   a plurality of conductive structures connecting the second substrate to the first substrate, wherein each conductive structure of the plurality of conductive structures is free of an encapsulating configuration,
   wherein the plurality of first stud bump structures and the plurality of conductive structures are arranged in a predetermined pattern over the first substrate, wherein the predetermined pattern includes the plurality of first stud bump structures disposed adjacent a center-region of a lateral side of the first die and the plurality of conductive structures disposed adjacent a corner-region of the first die.

9. The package on package structure of claim 8, wherein a stud bump of the plurality of first stud bump structures is connected to a bond pad.

10. The package on package structure of claim 8, wherein the conductive structure is a solder bump connecting the second substrate to the first substrate.

11. The package on package structure of claim 8, further comprising one or more copper pillars connecting the first die to the first substrate.

12. The package on package structure of claim 8, wherein each stud bump of the plurality of first stud bump structures has a material comprising aluminum, aluminum alloy, copper, copper alloy, gold, or gold alloy.

13. The package on package structure of claim 8, further comprising one or more second stud bump structures connected to an underside of the first substrate, wherein the one or more second stud bump structures comprise a stud bump and a solder ball encapsulating the stud bump.

14. A structure, comprising:
- a member being a die or a substrate;
- a plurality of stud bump structures on a surface of the member, each stud bump structure of the plurality of stud bump structures comprising:
  - a bond pad;
  - a conductive wire metallically connected to the bond pad, wherein the conductive wire forms a stud bump over the bond pad; and
  - a solder ball soldered to a top surface of the stud bump, the solder ball encapsulating the stud bump, wherein the solder ball has an exposed curvilinear surface over the top surface of the stud bump;
- a solder bump on the surface of the member, wherein the solder bump is free of an encapsulating configuration; and
- a moulding material around the plurality of stud bump structures and the solder bump.

15. The structure of claim 14, wherein the conductive wire comprises aluminum, aluminum alloy, copper, copper alloy, gold, or gold alloy.

16. The structure of claim 14, wherein the conductive wire comprises a lead-free conductor.

17. The structure of claim 14, wherein the top of the stud bump forms a tail.

18. The package structure of claim 1, wherein each stud bump of the plurality of stud bump structures has a material comprising aluminum or aluminum alloy.

\* \* \* \* \*